(12) United States Patent
Bachar et al.

(10) Patent No.: US 7,291,790 B2
(45) Date of Patent: Nov. 6, 2007

(54) APERTURES FOR SIGNAL SHAPING USING GROUND AND SIGNAL PTH BACK-DRILLING

(75) Inventors: Yuval Bachar, Sunnyvale, CA (US); Michael Grobman, Tel Aviv (IL)

(73) Assignee: Cisco Technology, Inc., San Jose, CA (US)

( * ) Notice: Subject to any disclaimer, the term of this patent is extended or adjusted under 35 U.S.C. 154(b) by 90 days.

(21) Appl. No.: 11/121,821

(22) Filed: May 2, 2005

(65) Prior Publication Data

US 2006/0243481 A1 Nov. 2, 2006

(51) Int. Cl.
*H01R 12/04* (2006.01)
*H05K 1/11* (2006.01)
*H05K 3/02* (2006.01)
*B23P 19/00* (2006.01)
*G06F 17/50* (2006.01)

(52) U.S. Cl. .......................... 174/262; 29/650; 29/703; 29/847; 716/2

(58) Field of Classification Search ........ 174/262–266; 361/792–795; 29/650, 702, 703, 84.6, 847; 716/2

See application file for complete search history.

(56) References Cited

U.S. PATENT DOCUMENTS

| | | | |
|---|---|---|---|
| 6,233,820 B1 * | 5/2001 | Hummelink | 29/847 |
| 6,392,160 B1 * | 5/2002 | Andry et al. | 174/261 |
| 2003/0042991 A1 * | 3/2003 | Cotant et al. | 333/24 R |
| 2006/0023439 A1 * | 2/2006 | Fraley et al. | 361/780 |

OTHER PUBLICATIONS

Tom Cohen, Practical Guidelines for the Implementation of Back Drilling Plated Through Hole Vias in Multi-gigabit Board Applications, Web ProForum Tutorials, copyright 2004 International Engineering Consortium, on the Internet: <http://www.iec.org>.

* cited by examiner

*Primary Examiner*—Jeremy C. Norris
(74) *Attorney, Agent, or Firm*—Charles E. Krueger

(57) ABSTRACT

A method and apparatus for shaping signals transmitted via plated through holes (PTHs) utilizes standard back-drilling techniques to reduce the resonant stub lengths of ground PTHs in the vicinity of a back-drilled signal PTH.

6 Claims, 6 Drawing Sheets

Back drilling of printed circuit board

APERTURES FOR SIGNAL SHAPING USING GROUND AND SIGNAL PTH BACK-DRILLING

BACKGROUND OF THE INVENTION

The system design aspect of recent years has driven the requirements for special tools and practices to ensure high speed signaling quality, especially for backplanes and connector via arrays.

The speeds of signals used in the industry increases at about an average rate of twice every two years. As a result the rise time of signals used on backplanes and other printed circuit boards (PCBs) decreases and the bandwidth required to deliver those signals from point to point increases (doubles every two years). Transport data rates of 3.125 Gigabits per second (Gbps) are now commonplace in board-to-board applications. As data rates increase to 5, 6.25, or 10 Gbps each part of the channel must be examined to increase performance.

A channel includes plated through holes (PTHs), also called vias, that transport signals into interior layers of a multi-layer PCB as depicted in FIG. 1. PTHs are common to many device packages such a Ball Grid Arrays (BGAs) and other connector types. Typically, in a backplane system a signal path between a transmitter and receiver includes several vias or PTHs.

PTHs are fabricated by drilling a hole through a multi-layer PCB. As is known in the art, a multi-layer PCB includes conductive traces separated by dielectric layers. The hole is plated with a conductor, such as copper, and a pad is formed to connect the PTH to a particular one of the conductive traces. As depicted in FIG. 1, a PTH 10 may be utilized to conduct a signal from a capture pad 12 mounted on the surface 14 of the PCB to an internal trace 16. In this case, the PTH has a pad on the surface for connecting with the capture pad and another pad connected to the selected internal trace. The PTH is insulated from all other traces.

At high frequencies the PTH joining a surface pad to an interior trace will affect signal shaping. Depending on the frequency of the signal and the dimensions of the PTH, signal energy may be reflected from the PTH or converted into radiation thus causing loss of signal power and other undesirable side effects.

It is known that the frequencies where the PTH acts as a filter are determined by the unused portion of the hole, referred to as the resonant stub. In FIG. 1, the portion of the PTH that extends beyond the selected trace layer is the resonant stub 18. One technique for controlling the effects of the stub is to alter its size by a technique known as "back-drilling", where plating is removed from the unused portion of the PTH by drilling from the back side of the PCB as depicted in FIG. 2. Back-drilling necessarily entails a tradeoff between manufacturing costs and electrical performance. Its effectiveness is limited by drilling depth accuracy and the increased cost of multi-depth drilling.

However, these simple back-drilling techniques (used to reduce the stub effect) in some cases are not adequate to guarantee high quality signaling at the speed of 2 Gbps and above.

Other known techniques exist that utilize more exotic technology, such as embedded passive or active filters in the PCB, to reduce reflections and shape signals. However, those techniques are expensive and, in most cases, not useful in mass production of PCBs.

The challenges in the field of high-frequency transmission continue to increase with demands for more and better techniques having greater simplicity and lower cost. Therefore, a need has arisen for a new system and method for controlling reflection and signal shaping caused by PTHs.

BRIEF SUMMARY OF THE INVENTION

In one embodiment of the invention, standard back-drilling technology is utilized to remove resonant stubs of ground PTHs in the vicinity of a back-drilled signal PTH to shape a signal and reduce reflections.

In another embodiment of the invention, the stub lengths of ground PTHs are varied to control signal shaping at selected signal frequencies.

Other features and advantages of the invention will be apparent in view of the following detailed description and appended drawings.

DETAILED DESCRIPTION OF THE INVENTION

Reference will now be made in detail to various embodiments of the invention. Examples of these embodiments are illustrated in the accompanying drawings. While the invention will be described in conjunction with these embodiments, it will be understood that it is not intended to limit the invention to any embodiment. On the contrary, it is intended to cover alternatives, modifications, and equivalents as may be included within the spirit and scope of the invention as defined by the appended claims. In the following description, numerous specific details are set forth in order to provide a thorough understanding of the various embodiments. However, the present invention may be practiced without some or all of these specific details. In other instances, well known process operations have not been described in detail in order not to unnecessarily obscure the present invention.

Figure 1:
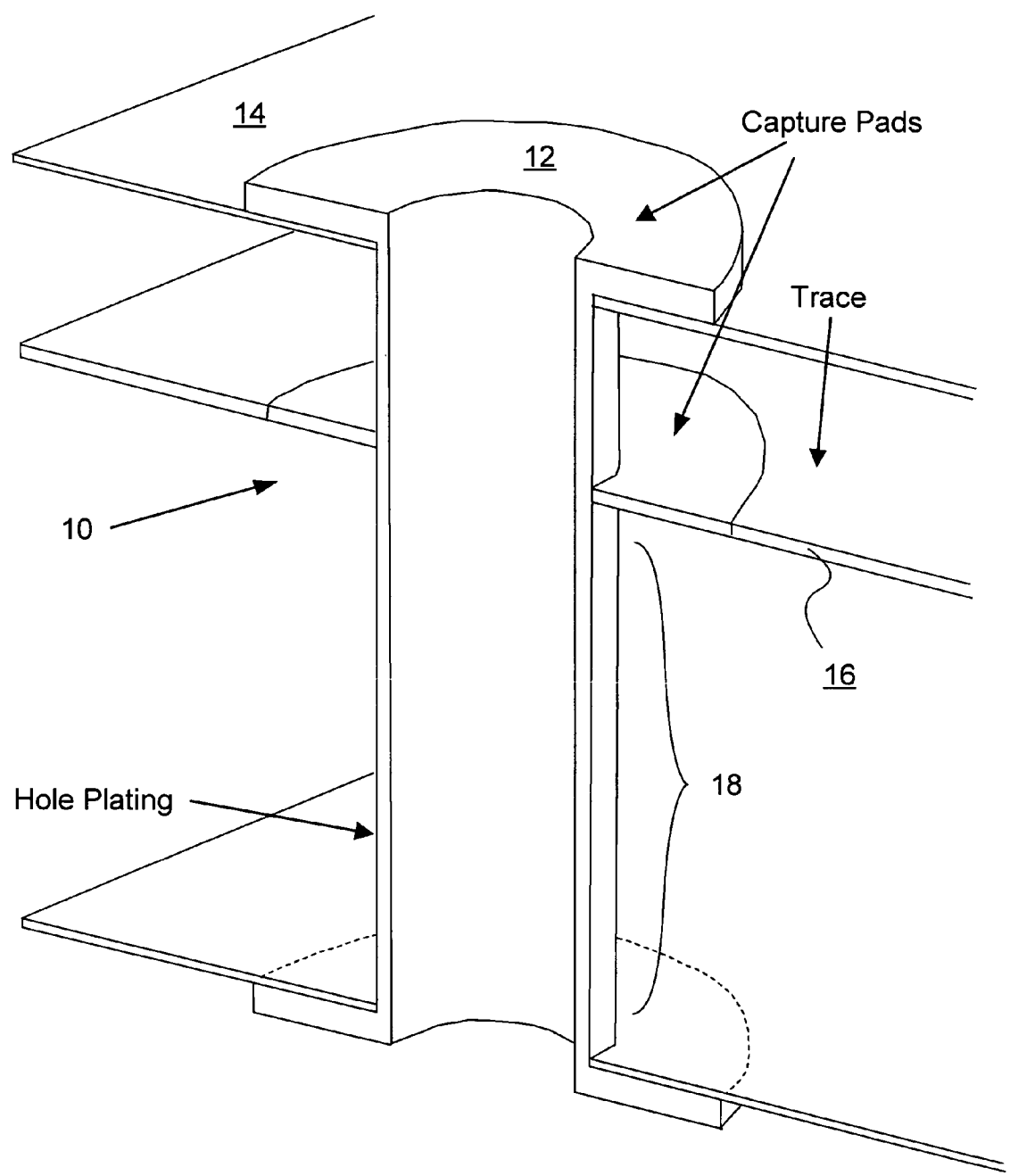
FIG. 1 is a perspective, cut-away view of a plated through hole.
Figure 2:
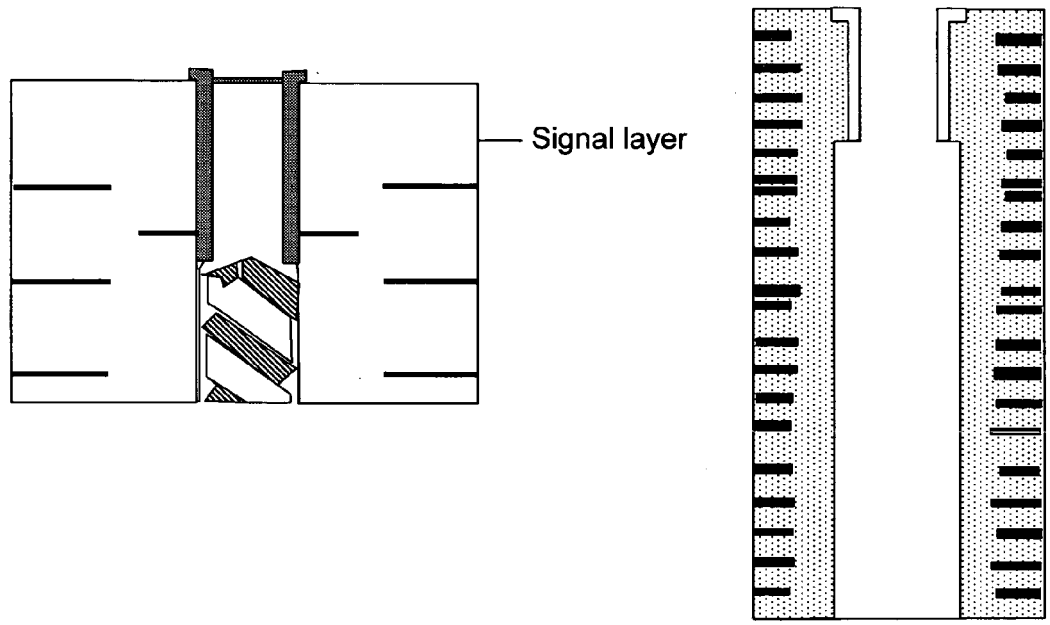
FIG. 2 comprises cross-sectional views depicting the back-drilling process.
Figure 3:
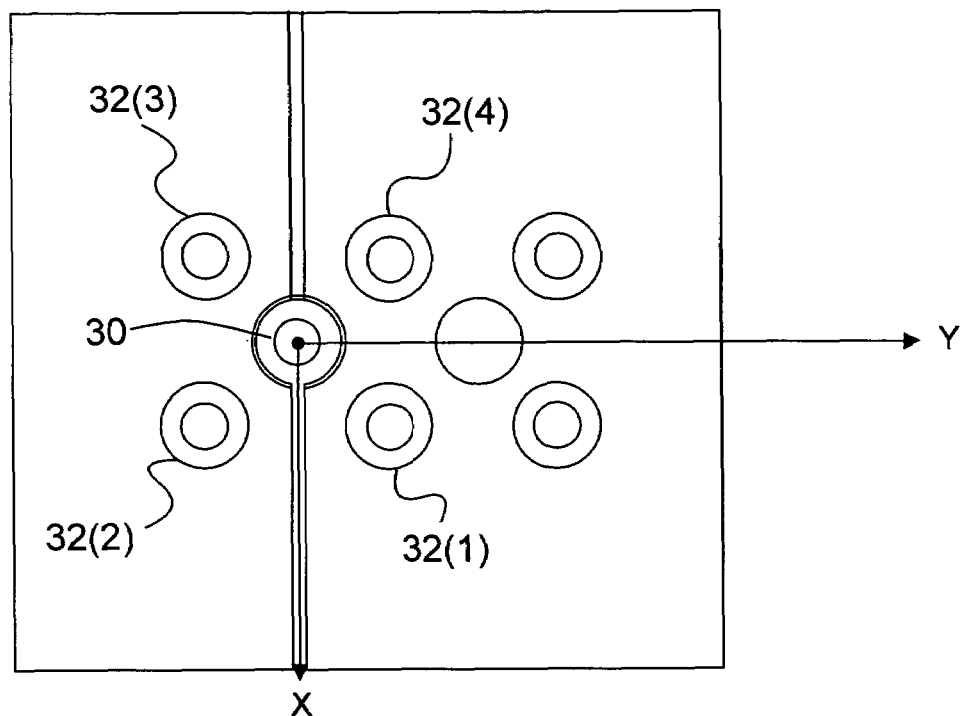
FIG. 3 is top view of a layout of signal and ground PTHs.
Figure 4:
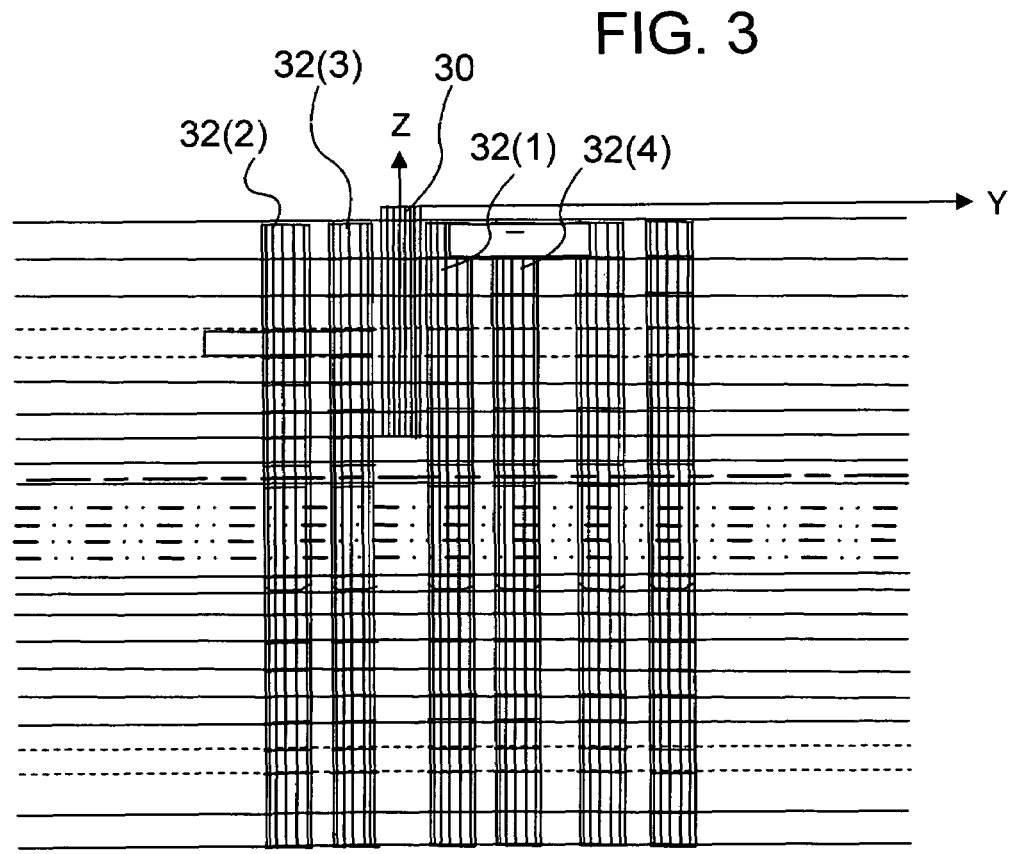
FIG. 4 is a side view of the layout of FIG. 3.

FIGS. 3 and 4 depict a layout of PTHs on a printed circuit board. As is known in the art, signal PTHs are usually placed between ground PTHs to reduce cross-talk between signals. In FIG. 3, signal PTH 30 is placed between first, second, third, and fourth ground PTHs 32(1)-32(4). FIG. 4 is a side views depicting a signal PTH 30 that has been back-drilled to reduce the size of the resonant stub and that is surrounded by the four ground PTHs 32(1)-32(4).

The inventors have discovered that the signal quality of a channel and the ability to transfer high frequency signals through a variety of board thicknesses can be improved by applying standard back-drilling techniques to reduce the resonant stub length of the ground PTHs surrounding a signal PTH.

Figure 5:
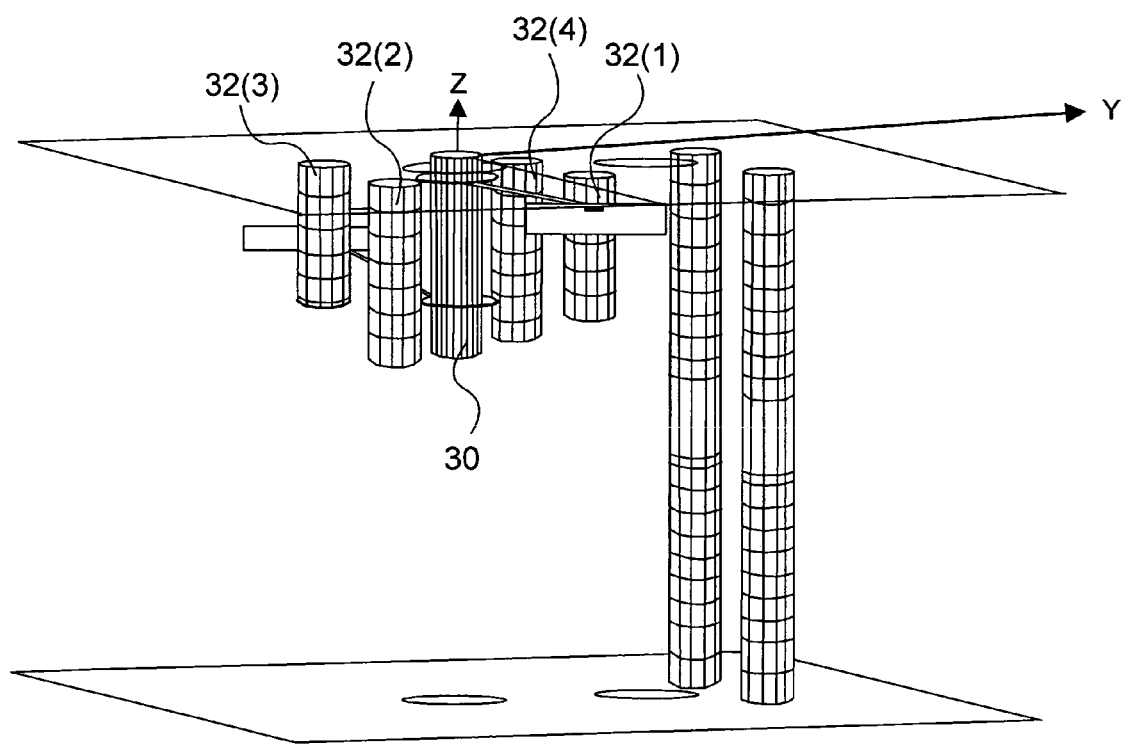
FIG. 5 is a perspective, cut-away view of an embodiment of the invention.

FIG. 5 depicts a preferred embodiment of the invention where ground PTHs 32(1)-32(4) have been back-drilled so the resonant stubs of the ground PTHs have been reduced in size.

Figure 6:
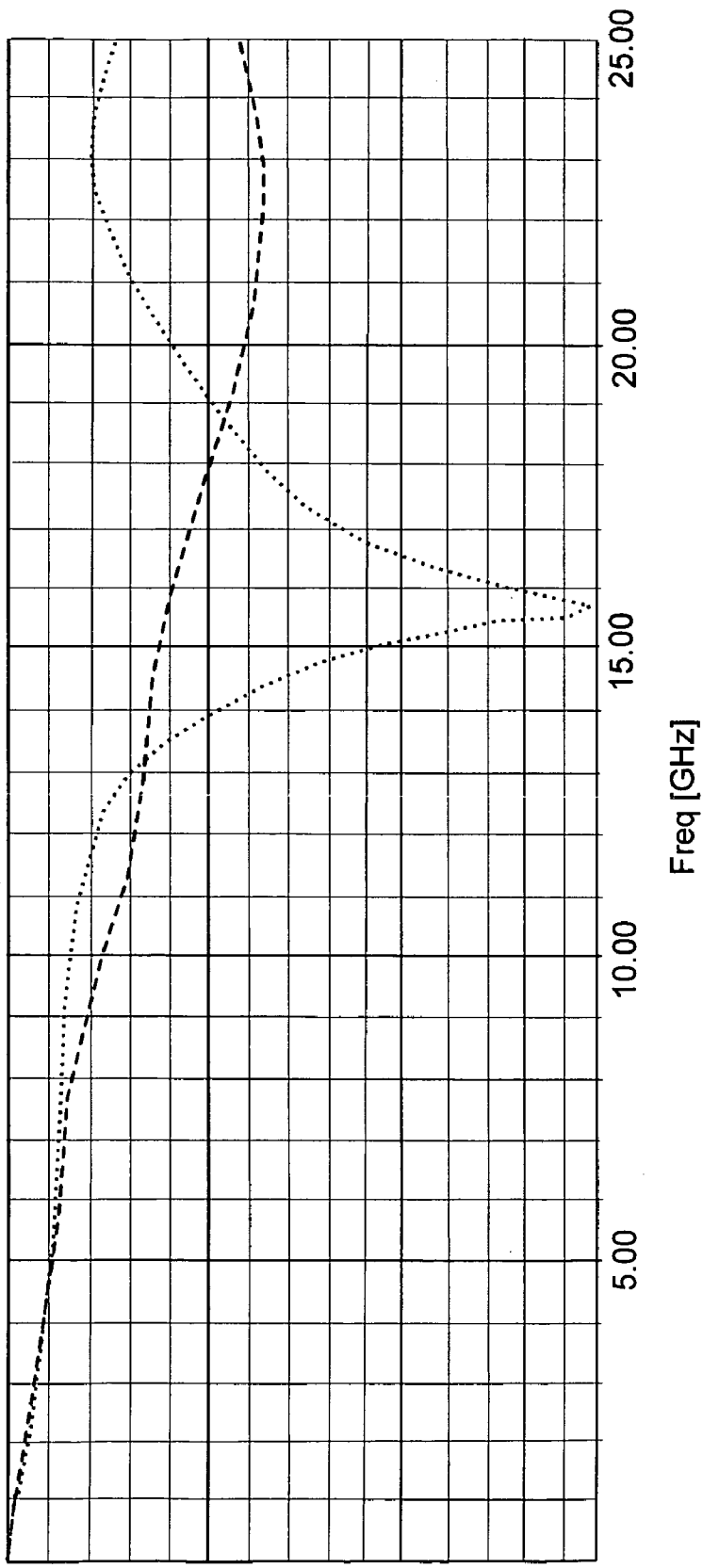
FIG. 6 is a graph illustrating the operation of an embodiment of the invention.

FIG. 6 is a graph depicting the attenuation of a signal at various frequencies. The dotted line depicts a significant increase in signal attenuation at 15 Ghz. As depicted by the dashed line, this signal attenuation is much less pronounced after the ground PTHs have been back-drilled. The effect of the ground PTH back-drilling as shown in the graph makes the channel much more "flat", i.e. there is much less resonance and reflection on the channel. This has a direct effect on the signal quality at the output of that channel/via structure.

In the embodiment described above standard back-drilling techniques are utilized. The signal and ground PTHs can be back-drilled during the same fabrication without adding significant cost or complexity to manufacturing a PCB.

In a preferred embodiment, the ground PTHs in a backplane are back-drilled, however the technique is useful in any board used to form high-frequency signal transmission channels.

In another embodiment of the invention, the lengths of the resonant stubs of the signal and ground PTHs can be varied to shape the transmitted signal according to the requirements of the channel.

Figure 7:
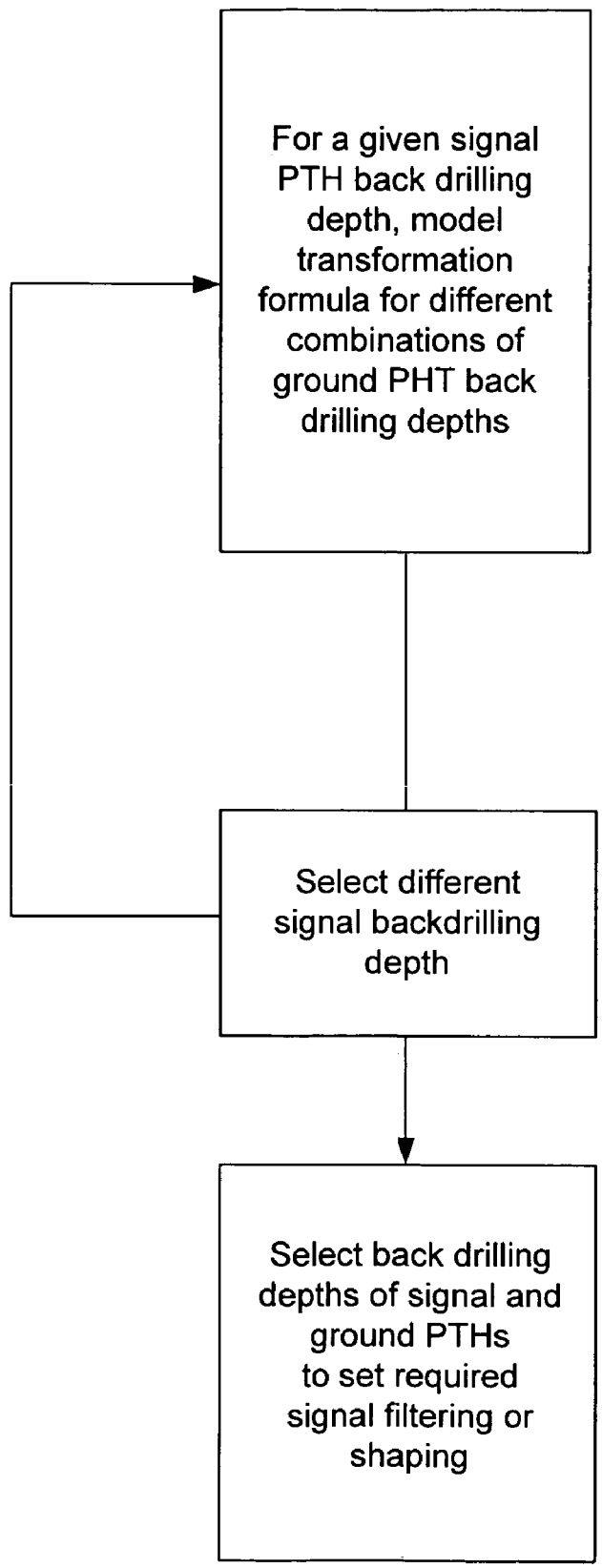
FIG. 7 is a flow chart depicting steps performed by an embodiment of the invention.

In this embodiment of the invention, signal PTH back-drilling combined with the GND PTH back-drilling creates a filter effect on the signal. As depicted in the flow chart of FIG. 7, the filtering formula is changed by adjusting the depth of the back-drilling of the signal PTH and back-drilling the ground PTHs to the same or different depths.

Using modeling tools (like HFSS manufactured by Ansoft) the transformation formula of the channel is extracted for every back-drilling depth and the required signal filtering or shaping can be set. Thus, the output signal can be controlled, filtered and shaped according to the transformation formula of the PTH structure and can be adjusted by changing the back-drilling depths.

The invention has now been described with reference to the preferred embodiments. Alternatives and substitutions will now be apparent to persons of skill in the art. For example, the diagrams depict a signal PTH surrounded by four ground PTHs, however, the invention is not limited to any number or configuration of PTHs. Further, modeling programs other than HFSS can be utilized as is understood by persons of skill in the art. Accordingly, it is not intended to limit the invention except as provided by the appended claims.

What is claimed is:

1. A method comprising:
    back-drilling a signal PTH coupling a surface connector to a first interior conductive layer of a printed circuit board having a plurality of interior conductive layers separated by dielectric layers and utilizing plated through holes (PTHs) connecting a pad on the surface of the printed circuit board to a first interior conductive layer, where the first interior conductive layer is not a ground layer, and with the portion of PTH extending beyond the particular interior conductive layer termed the resonant stub of the PTH, where the back-drilling removes a part of the resonant stub of signal PTH;
    back-drilling each ground PTH in a plurality of ground PTHs, with each ground PTH in the plurality coupled to a ground layer and disposed near the signal PTH to reduce crosstalk between signal PTHs, where back-drilling removes at least a part of the resonant stub of each ground PTH in the plurality.

2. The method of claim 1 further comprising:
    removing a specified length of the resonant stub of a first ground PTH in the plurality to improve signal transmission at a selected high frequency.

3. An apparatus comprising:
    a printed circuit board having a plurality of interior conductive layers separated by dielectric layers;
    a signal PTH coupling a surface connector to a first interior conductive layer which is not a ground layer and having a resonant stub being the part of the signal PTH extending beyond the first conductive layer, with the signal PTH having a back-drilled resonant stub to improve signal transmission over a selected frequency or band of frequencies; and
    a plurality of ground PTHs, with each ground PTH in the plurality disposed near the signal PTH to reduce crosstalk between signal PTHs, and with each ground PTH in the plurality having a back-drilled resonant stub to further improve signal transmission at the selected frequency or band of frequencies.

4. The apparatus of claim 3 where:
    the resonant stub of a first ground PTH has a selected length to improve signal transmission at the selected frequency or band of frequencies.

5. A method comprising:
    computer modeling the signal transmission characteristics of a selected frequency or band of frequencies for different configurations of resonant stub lengths, with each configuration including, a signal plated through hole (PTH), coupled to an interior conductive layer of a printed circuit board (PCB) that is not a ground layer, and a plurality of ground plated through holes (PTHs), coupled to a ground conductive layer of a PCB, where a resonant stub is the part of a PTH that extends beyond the layer to which it is coupled;
    selecting a preferred configuration of resonant stub lengths having signal characteristics suitable for transmission of a selected frequency or band of frequencies;
    back-drilling a configuration of PTHs formed in a PCB, so that each PTH in the configuration on the PCB has a resonant stub length equal to the corresponding resonant stub length of the preferred configuration of resonant stub lengths determined by computer modeling.

6. A system comprising:
    means for computer modeling the signal transmission characteristics of a selected frequency or band of frequencies for different configurations of resonant stub lengths and determine a preferred configuration, with each configuration including, a signal plated through hole (PTH), coupled to an interior conductive layer of a printed circuit board (PCB) that is not a ground layer, and a plurality of ground plated through holes (PTHs), coupled to a ground conductive layer of a PCB, where a resonant stub is the part of a PTH that extends beyond the layer to which it is coupled; and
    means for back-drilling a configuration of PTHs, formed on a PCB, so that each PTH on the PCB has a resonant stub length equal to the corresponding resonant stub length of the preferred configuration of resonant stub lengths determined by computer modeling.

* * * * *